US008976369B2

(12) United States Patent
Kuwabara

(10) Patent No.: US 8,976,369 B2
(45) Date of Patent: Mar. 10, 2015

(54) METHOD FOR EVALUATING THIN-FILM-FORMED WAFER

(75) Inventor: Susumu Kuwabara, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 68 days.

(21) Appl. No.: 13/696,947

(22) PCT Filed: Mar. 29, 2011

(86) PCT No.: PCT/JP2011/001852
§ 371 (c)(1),
(2), (4) Date: Nov. 8, 2012

(87) PCT Pub. No.: WO2011/148555
PCT Pub. Date: Dec. 1, 2011

(65) Prior Publication Data
US 2013/0063733 A1 Mar. 14, 2013

(30) Foreign Application Priority Data
May 28, 2010 (JP) .................................. 2010-122187

(51) Int. Cl.
*G01B 11/28* (2006.01)
*G01N 21/86* (2006.01)
(Continued)

(52) U.S. Cl.
CPC ................ *G01B 11/06* (2013.01); *H01L 22/12* (2013.01); *G01B 11/0633* (2013.01)
USPC ....................... 356/630; 250/559.27

(58) Field of Classification Search
CPC ............... G01B 11/06; G01B 11/0633; G01B 11/0625; H01L 22/12
USPC ...................... 356/630, 632, 504; 250/559.27
See application file for complete search history.

(56) References Cited

U.S. PATENT DOCUMENTS

| 5,333,049 A | 7/1994 | Ledger |
| 5,543,919 A * | 8/1996 | Mumola ........................ 356/632 |

(Continued)

FOREIGN PATENT DOCUMENTS

| JP | A-5-248825 | 9/1993 |
| JP | A-7-134007 | 5/1995 |
| JP | A-7-260437 | 10/1995 |
| JP | A-8-264605 | 10/1996 |

(Continued)

OTHER PUBLICATIONS

Jun. 11, 2013 Japanese Office Action issued in Japanese Patent Application No. 2010-122187 (with partial translation).

(Continued)

*Primary Examiner* — Kara E Geisel
*Assistant Examiner* — Dominic J Bologana
(74) *Attorney, Agent, or Firm* — Oliff PLC

(57) ABSTRACT

A method for evaluating a thin-film-formed wafer, being configured to calculate a film thickness distribution of a thin film of the thin-film-formed wafer having the thin film on a surface of a substrate, wherein light having a single wavelength $\lambda$ is applied to a partial region of a surface of the thin-film-formed wafer, reflected light from the region is detected, reflected light intensity for each pixel obtained by dividing the region into many pieces is measured, a reflected light intensity distribution in the region is obtained, and the film thickness distribution of the thin film in the region is calculated from the reflected light intensity distribution. The method enables a film thickness distribution of the micro thin film (an SOI layer) that affects a device to be measured on the entire wafer surface at a low cost with a sufficient spatial resolution in a simplified manner.

18 Claims, 9 Drawing Sheets

(51) Int. Cl.
*G01V 8/00* (2006.01)
*G01B 11/06* (2006.01)
*H01L 21/66* (2006.01)

(56) References Cited

U.S. PATENT DOCUMENTS

| | | | |
|---|---|---|---|
| 5,555,472 | A | 9/1996 | Clapis et al. |
| 5,729,343 | A | 3/1998 | Aiyer |
| 5,856,871 | A * | 1/1999 | Cabib et al. ............ 356/503 |
| 5,982,496 | A * | 11/1999 | Ziger ..................... 356/630 |
| 2002/0173084 | A1 | 11/2002 | Ohkawa |
| 2006/0030060 | A1 * | 2/2006 | Noguchi et al. ............ 438/14 |
| 2009/0168079 | A1 * | 7/2009 | Yang ..................... 356/630 |

FOREIGN PATENT DOCUMENTS

| | | |
|---|---|---|
| JP | A-9-218017 | 8/1997 |
| JP | A-2002-343842 | 11/2002 |
| JP | A-2008-139065 | 6/2008 |

OTHER PUBLICATIONS

Dec. 4, 2012 International Preliminary Report on Patentability issued in International Patent Application No. PCT/JP2011/001852.
International Search Report issued in International Patent Application No. PCT/JP2011/001852 mailed Jul. 5, 2011.
Sep. 23, 2014 Office Action and Search Report issued in Chinese Application No. 201180026457.4 (including English Translation).

* cited by examiner

Fig. 3
(a) SOI SURFACE REFLECTANCE
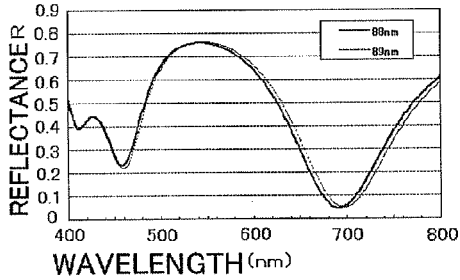
(b) SOI SURFACE REFLECTANCE
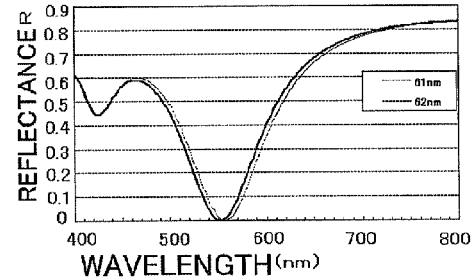
(c) SOI SURFACE REFLECTANCE
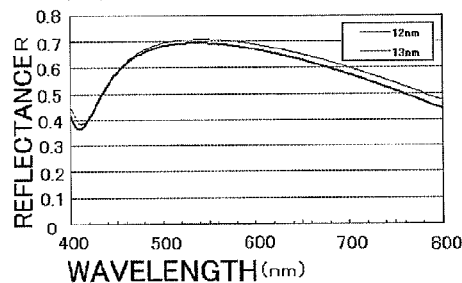
(d) Ge/SiO2/Si SURFACE REFLECTANCE
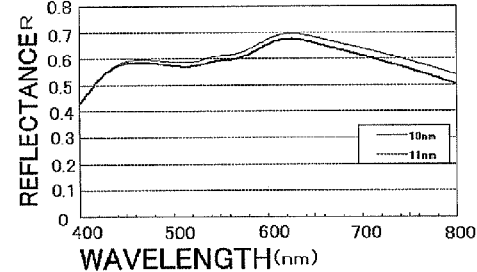
(e) InGaAs/SiO2/Si SURFACE REFLECTANCE
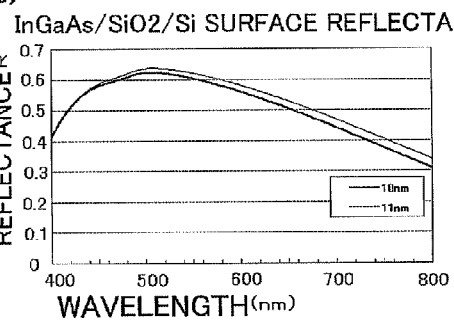
(f) Si/QUARTZ SURFACE REFLECTANCE
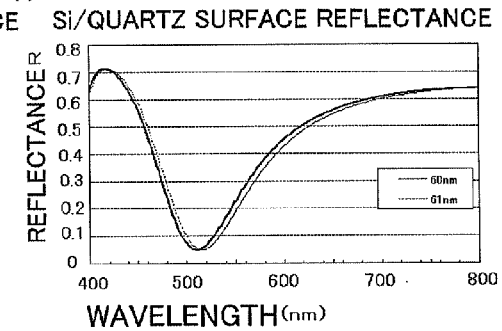

Fig. 6
MEASUREMENT REGION 1    MEASUREMENT REGION 2
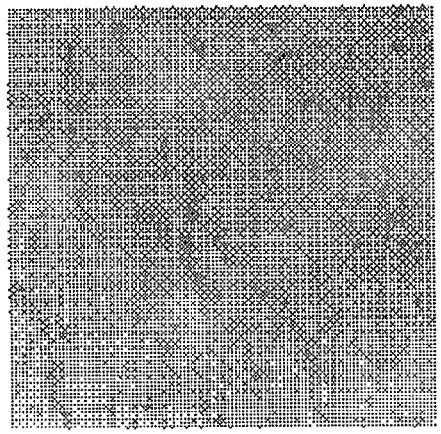 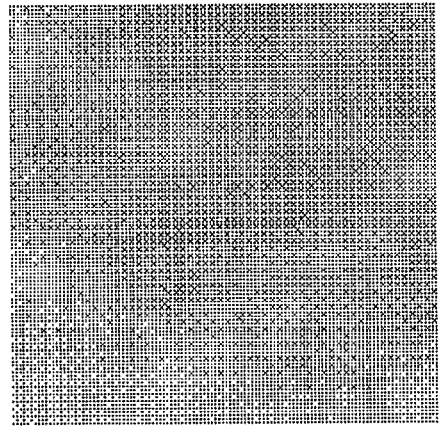
MEASUREMENT REGION : 0.5mm × 0.5mm
PIXEL : 1-μm-SQUARE Fig. 8
MEASUREMENT REGION 3    MEASUREMENT REGION 4
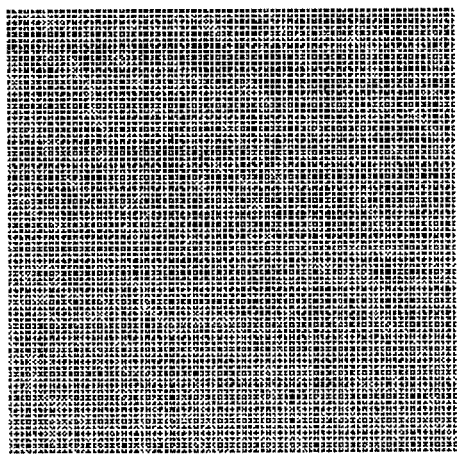 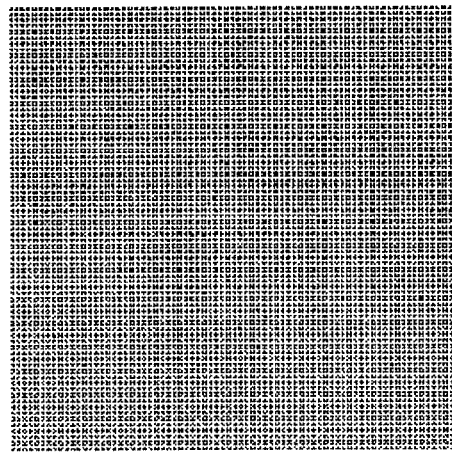
MEASUREMENT REGION : 0.5mm × 0.5mm
PIXEL : 1-μm-SQUARE

METHOD FOR EVALUATING THIN-FILM-FORMED WAFER

TECHNICAL FIELD

The present invention relates to a method for evaluating a thin-film-formed wafer that calculates a film thickness distribution of a thin-film-formed wafer for use in fabrication of a semiconductor device, and more particularly to a method for evaluating an SOI layer film thickness distribution.

BACKGROUND ART

In recent years, with miniaturization of design rules, a film thickness distribution of an SOI layer of an SOI wafer for use in fabrication of an SOI device, especially fabrication of an FD-SOI (Fully Depleted SOI) device has affected a device manufacturing process as well as transistor characteristics. In an integrated circuit, uniforming characteristics of transistors constituting a circuit is important.

As an existing film thickness measuring method for calculating a film thickness distribution of a thin film of a thin-film-formed wafer that has the thin film on a surface of the substrate, film thickness measurement for each point based on spectroscopic ellipsometry or reflection spectroscopy is general, but a film thickness distribution measuring device that can perform film thickness distribution measurement in a wide plane with a resolution of approximately 1 µm is not commercially available.

In the point measurement based on the spectroscopic ellipsometry or the reflection spectroscopy, a spectrum in a given wavelength range (which is generally a visual light range) is taken in accordance with each measurement point, and this spectrum is fitted into a model film architecture, whereby film thickness at each measurement point is obtained. Therefore, when performing measurement with a resolution of approximately 1 µm is tried, the number of the measurement points is extremely increased, and hence the measurement is actually impossible because of the limitation in amount of calculation and time.

Further, to effect the spectral measurement, since a wavelength region in a broad wavelength range is required, it is practically impossible to increase a spatial resolution and effect the multipoint film thickness measurement. Therefore, as a device that can collectively measure the entire surface of the wafer by using these methods, there is only a device with a spatial resolution of approximately several 100 µm under existing conditions.

As described above, there has been demanded the method for evaluating a thin-film-formed wafer, which can highly accurately and simply perform the measurement of a film thickness distribution of a thin film, especially an SOI layer on an entire surface of the wafer at a low cost.

It is to be noted that Patent Document 1 discloses a technology of applying white light to an SOI, dispersing reflected light in accordance with each wavelength, and calculating an SOI layer film thickness from interference information of each wavelength, and Patent Document 2 discloses that a laser beam of 488 nm is applied to an SOI layer which is less than 1 µm, regular reflected light is detected, and a variation in film thickness within the plane is inspected based on an interference pattern formed with irradiation light.

CITATION LIST

Patent Document

Patent Document 1: Japanese Unexamined Patent Application Publication No. 2002-343842

Patent Document 2: Japanese Unexamined Patent Application Publication No. H08-264605

SUMMARY OF INVENTION

In view of the above-described problems, the present invention provides a method for evaluating a wafer with a thin film that can highly accurately and simply perform measurement of a film thickness distribution of a micro thin film (an SOI layer), which affects a device, on an entire wafer surface at a low cost.

To achieve the object, according to the present invention, there is provided a method for evaluating a thin-film-formed wafer, the method being configured to calculate a film thickness distribution of a thin film of the thin-film-formed wafer having the thin film on a surface of a substrate, wherein light having a single wavelength $\lambda$ is applied to a partial region of a surface of the thin-film-formed wafer, reflected light from the region is detected, reflected light intensity for each pixel obtained by dividing the region into many pieces is measured, a reflected light intensity distribution in the region is obtained, and the film thickness distribution of the thin film in the region is calculated from the reflected light intensity distribution.

As described above, the evaluation method for selecting light having an appropriate single wavelength $\lambda$, applying the light having the single wavelength $\lambda$ to the partial region on the surface of the thin-film-formed wafer, obtaining the reflected light intensity distribution in the region by measuring the reflected light intensity for each pixel obtained by detecting the reflected light from the region and dividing the region into many pieces, and calculating the film thickness distribution of the thin film in the region from the reflected light intensity distribution enables reducing the amount of calculation since the wavelength of the applied light is restricted to one wavelength and enables simply conducting the measurement of the film thickness distribution of the thin film on the entire wafer surface with a sufficient spatial resolution at a low cost.

Further, in this situation, as the wavelength $\lambda$, it is preferable to select the wavelength $\lambda$ in such a manner that reflectance (R) of irradiation light calculated from a film thickness set value of the thin film of the thin-film-formed wafer becomes 0.2 or above and an absolute value of a reflectance fluctuation coefficient ($\Delta(R/R)$) with respect to the film thickness of the thin film becomes 0.02/1 nm or above.

In the method for evaluating a thin-film-formed wafer according to the present invention, when the wavelength having a large reflectance fluctuation with respect to the film thickness set value of the thin film is selected as the wavelength $\lambda$ of the light to be applied, an accurate evaluation can be performed. Moreover, if the reflectance (R) of the irradiation light calculated from the film thickness set value of the thin film of the thin-film-formed wafer is 0.2 or above, the reflected light intensity is sufficient, and the accurate evaluation can be carried out. Additionally, if the absolute value of the reflectance fluctuation coefficient for the film thickness of the thin film is 0.02/1 nm or above, sensitivity for the fluctuation in film thickness of the thin film is sufficient, and the accurate evaluation can be performed.

Further, in this situation, it is preferable to select the wavelength $\lambda$ in such a manner that the absolute value of the reflectance fluctuation coefficient ($\Delta R/R$) becomes 0.05/1 nm or above.

As described above, when the wavelength that allows the absolute value of the reflectance fluctuation coefficient ($\Delta R/R$) to be 0.05/1 nm or above is selected, the sensitivity for the fluctuation in film thickness can be enhanced, and the more accurate evaluation can be performed.

Furthermore, in this situation, it is preferable for the wavelength λ to be a single wavelength selected from visible light wavelengths.

In the method for evaluating a thin-film-formed wafer according to the present invention, a general optical microscope apparatus can be used, and a single wavelength selected from visible light wavelengths can be used, and hence the low-cost evaluation method can be provided.

Moreover, in this situation, it is preferable for a size of one side of the pixel to be ½ or above of the wavelength λ and 100 µm or below.

As described above, if the size of one side of the pixel is ½ or above of the wavelength λ and 100 µm or below, focusing is no longer difficult, and the film thickness distribution of the thin film of the thin-film-formed wafer can be more accurately calculated.

Additionally, in this situation, the region can be matched with a lithography exposure site of a device manufacturing process.

In the method for evaluating a thin-film-formed wafer according to the present invention, when a magnification ratio or a viewing field range of a microscope to be used is adjusted, the region to which the light is applied can be matched with the lithography exposure site in the device manufacturing process.

Further, in this situation, a film thickness distribution of the entire surface of the thin-film-formed wafer can be obtained by calculating the film thickness distribution of the thin film in the region at a plurality of positions.

As described above, when the film thickness distribution of the thin film in the partial region is calculated at the plurality of positions, the entire wafer surface can be evaluated. According to the method for evaluating a thin-film-formed wafer of the present invention, since the wavelength is restricted to one wavelength even in such an evaluation of the entire wafer surface, an amount of calculation can be reduced, and the thin-film-formed wafer can be evaluated at a low cost.

Furthermore, in this situation, a thin-film-formed wafer which has a second thin film formed between the substrate and the thin film or on the thin film can be used as the thin-film-formed wafer that is an evaluation target.

As described above, according to the present invention, as the thin-film-formed wafer to be evaluated, it is possible to use the thin-film-formed wafer that has the second thin film formed between the substrate and the thin film or on the thin film, namely, that has the two layers of the thin films.

Additionally, in this situation, the substrate and the thin film can be made of silicon single crystal, and the second thin film formed between the substrate and the thin film can be a silicon oxide film.

As described above, as the thin-film-formed wafer to be evaluated, it is possible to use an SOI wafer in which the substrate and the thin film are made of silicon single crystal and the second thin film is formed of the silicon oxide film. When the appropriate wavelength λ is selected in accordance with a combination of the SOI layer film thickness and the BOX layer (a silicon oxide film layer) thickness, the film thickness distribution and the uniformity of the SOI layer film thickness can be quantitatively evaluated with a resolution of 1 µm or below.

Effects of the Invention

As described above, according to the present invention, it is possible to provide the film thickness distribution measurement of a thin film or the method for evaluating uniformity of a film thickness that enables the measurement of a micro thin-film film thickness distribution that affects a device on an entire wafer surface with a sufficient spatial resolution in a simple manner at a low cost. Furthermore, when a wavelength with a large fluctuation in reflectance with respect to a film thickness set value of a thin film is selected, the further accurate evaluation can be performed. In case of evaluating an SOI wafer in particular, when an appropriate wavelength is selected in accordance with a combination of an SOI layer film thickness and a BOX layer (a silicon oxide film layer) thickness, a film thickness distribution or uniformity of the SOI layer film thickness can be quantitatively evaluated with a resolution of 1 µm or below.

BRIEF DESCRIPTION OF DRAWINGS

FIG. 3 shows results of calculating wavelength dependency of reflectance R in each of Embodiments 1 to 6;

FIG. 6 show microscopic images of the SOI layer in two measurement regions in Example 1;

FIG. 8 shows microscopic images of the SOI layer in two measurement regions in Example 2.

BEST MODE(S) FOR CARRYING OUT THE INVENTION

The present invention will now be more specifically explained hereinafter.

As described above, there has been conventionally demanded a method for evaluating a thin-film-formed wafer, which can perform thin-film (an SOI layer) film thickness measurement and uniformity evaluation of a thin-film (the SOI layer)-formed wafer over an entire wafer surface in a simple manner at a low cost.

Therefore, as a result of a great variety of considerations, the present inventor discovered a method for evaluating a thin-film-formed wafer that calculates a thin-film film thickness distribution of a thin-film-formed wafer having a thin film on a surface of the substrate, which is a method for evaluating a thin-film-formed wafer characterized in that light having a single wavelength λ is applied to a partial region on the surface of the thin-film-formed wafer, reflected light from the region is detected, reflected light intensity for each pixel obtained by dividing the region into many pieces is measured to acquire a reflected light intensity distribution in the region, and the film thickness distribution of the thin film in the region is calculated from the reflected light intensity distribution. Since the light to be applied is restricted to one wavelength, the measurement of the film thickness distribution of the micro thin film that affects a device on the entire wafer surface can be performed with a sufficient spatial resolution in a simple manner at a low cost.

Further, the present inventor paid attention to a fluctuation in reflectance with respect to the film thickness of the thin film (the SOI layer) and conducted the following experiment.

Figure 1:
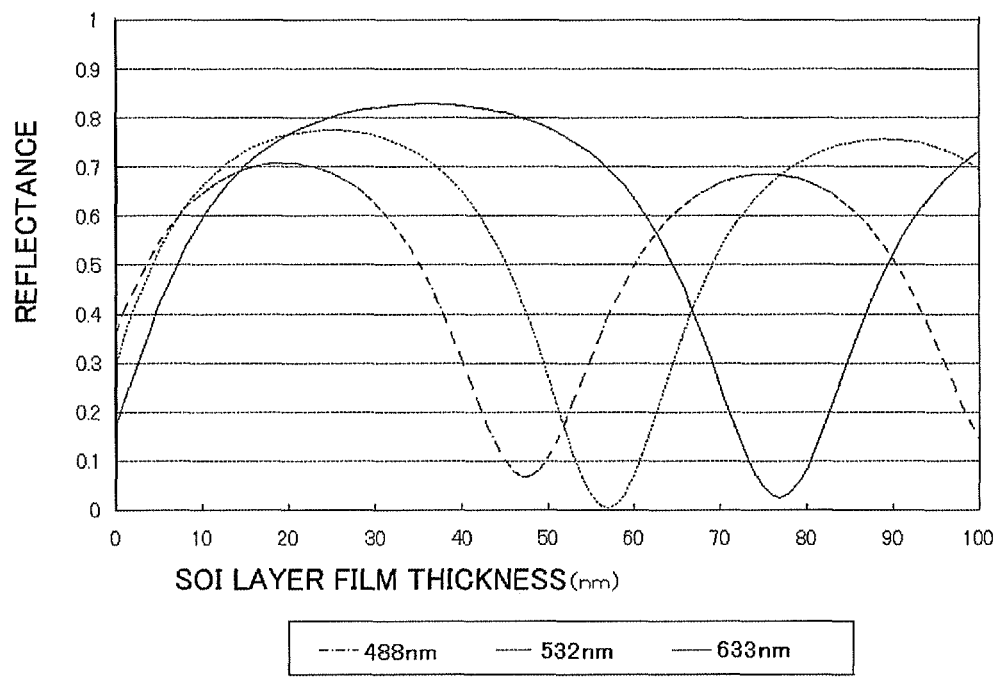
FIG. 1 is a view showing fluctuations in reflectance of three typical wavelengths with respect to SOI layer film thicknesses when a BOX layer thickness of an SOI wafer is fixed (145 nm)

FIG. 1 is a view showing that a fluctuation in reflectance of each of three typical wavelengths (488 nm, 532 nm, and 633 nm) with respect to an SOI layer film thickness when a BOX (a silicon oxide film: a buried oxide film) layer thickness of an SOI wafer (an SOI layer/a BOX layer/an Si substrate) is 145 nm is obtained by a calculation.

According to a calculation result in this FIG. 1, it can be observed that the reflectance when using each of these three wavelengths has intensive dependency on the SOI layer film thickness. That is, it was revealed that, when reflectance (reflected light intensity) is measured by using an appropriate wavelength, the obtained value can be converted into the SOI layer film thickness. That is, it was found out that, when the appropriate wavelength is used, the reflectance can be easily and accurately converted into the SOI layer film thickness in an SOI layer film thickness region where the reflectance greatly fluctuates.

For example, it was revealed that, when the film thickness of the SOI layer is approximately 90 nm, using irradiation light having a wavelength of 488 nm or 633 nm enables easily and accurately performing conversion into the SOI layer film thickness since the reflectance largely fluctuates as compared with a case that irradiation light with a wavelength of 532 nm that has a substantially fixed reflectance is used.

The present inventor discovered that utilizing such characteristics and selecting a single wavelength which causes a large fluctuation in reflectance with respect to a set value of the film thickness of the thin film can enable more accurately converting the reflectance into the film thickness of the thin film.

That is, in the present invention, an appropriate wavelength $\lambda$ is selected in accordance with a thickness of a thin film of the thin-film-formed wafer, light having the wavelength $\lambda$ is applied to a surface of the thin-film-formed wafer, and reflectance from an SOI surface is measured with a high spatial resolution in accordance with each of many divided regions (pixels), whereby a film thickness distribution or uniformity of the SOI layer can be more accurately evaluated.

In general, in an SOI wafer manufacturing process, an SOI layer film thickness and a BOX layer film thickness of an SOI wafer to be manufactured are set based on a user's specifications, the film thickness set values are determined as target values, the SOI wafer is manufactured, and then an in-plane distribution of the SOI layer film thickness is evaluated in an inspection process and the like.

According to the present invention, the set values of the SOI layer film thickness and the BOX layer film thickness are used, a relationship between a wavelength of irradiation light and reflectance of reflected light or the like is calculated by a simulation, an appropriate wavelength $\lambda$ is selected as the irradiation light used for the measurement, the light is applied to the SOI wafer, reflected light is detected, and the SOI layer film thickness distribution is thereby evaluated.

As a method for selecting the wavelength $\lambda$, in the SOI layer film thickness and the BOX layer film thickness (i.e., target values in manufacture of the SOI wafer) set in manufacture of the SOI wafer as an evaluation target, irradiation wavelength dependency of a reflectance difference and a reflectance fluctuation coefficient involved by a fluctuation in SOI layer film thickness are calculated in advance, and the single wavelength $\lambda$ is selected from wavelengths that cause an increase in fluctuation of the reflectance. Further, light having the selected wavelength $\lambda$ is applied to a partial region on the SOI surface, reflected light from the region is detected, reflected light intensity is measured in accordance with each pixel obtained by dividing the region into many pieces, a reflected light intensity distribution in the region is thereby obtained, and a film thickness distribution of the SOI layer in the region is calculated from the reflected light intensity distribution.

Although embodiments according to the present invention will be specifically explained hereinafter, the present invention is not restricted thereto.

As a thin-film-formed wafer to which the evaluation method according to the present invention can be applied, there is an SOI wafer, and SOI wafer having any combination of an SOI layer film thickness and a BOX layer film thickness can be evaluated. Further, besides the SOI wafer, a thin-film-formed wafer which has a single layer film or a two-layer film other than SOI/BOX can be evaluated and, as thin-film materials thereof, there are, e.g., a semiconductor material such as SiGe, Ge, III-V, and II-VI compound semiconductors, a high-dielectric insulating material such as $Al_2O_3$, quartz, or $HfO_2$, Graphene, and others. Further, even though two or more layers are used, when a thickness of any other layer than a layer which is a film thickness distribution measurement target is uniform or any other layer has a smaller refractive index, the evaluation method can be sufficiently applied.

A situation where an SOI wafer is evaluated will now be described hereinafter.

In the evaluation method according to the present invention, in an SOI layer film thickness and a BOX layer film thickness set in a manufacturing stage of an SOI wafer to be evaluated (i.e., target values in manufacture of the SOI wafer), irradiation wavelength dependency of a reflectance difference and a reflectance fluctuation coefficient involved by a fluctuation in SOI layer film thickness are calculated by a simulation in advance, and a single wavelength $\lambda$ is selected from wavelengths that cause an increase in reflectance and reflectance fluctuation.

Specifically, the BOX layer film thickness is fixed to a set value, and wavelength dependency of reflectance R is calculated with respect to both a set value L (nm) of the SOI layer film thickness and, e.g., L+1 (nm) obtained by increasing this set value L (nm) by 1 nm. Further, a reflectance fluctuation coefficient ($\Delta R/R_L$) obtained by dividing a difference between these reflectances ($\Delta R = R_{L+1} - R_L$) by the reflectance is also calculated. Furthermore, a wavelength $\lambda$ that sufficiently increases reflectance (R) of irradiation light and the reflectance fluctuation coefficient ($\Delta R/R_L$) is selected.

At this time, it is preferable to select the wavelength $\lambda$ in such a manner that the reflectance (R) of the irradiation light calculated from the film thickness set value of the thin film of the thin-film-formed wafer becomes 0.2 or above and an absolute value of the reflectance fluctuation coefficient ($\Delta R/R$) with respect to the film thickness of the thin film becomes 0.02/1 nm or above.

If the reflectance is not smaller than 0.2, the reflected light intensity is sufficient, and an accurate evaluation can be performed. Further, if the absolute value of the reflectance fluctuation coefficient is not smaller than 0.02/nm, sensitivity for a fluctuation in film thickness is satisfactory, and an accurate evaluation can be carried out. Therefore, it is preferable to select a wavelength that allows the reflectance to be 0.2 or above and the absolute value of the reflectance fluctuation coefficient to be 0.02/nm or above. Furthermore, if a wavelength that allows the absolute value of the reflectance fluctuation coefficient to be 0.05/nm or above is selected, the sensitivity for a fluctuation in film thickness can be enhanced, and the further accurate evaluation can be performed.

Then, light having the single wavelength λ selected in advance as described above is applied to a partial region on the surface of the SOI wafer to be evaluated, reflected light from the region irradiated with the light is detected, reflected light intensity is measured in accordance with each pixel obtained by dividing the region into many pieces, a reflected light intensity distribution in the region is thereby obtained, and the film thickness distribution of the thin film in the region is calculated from the reflected light intensity distribution.

Figure 2:
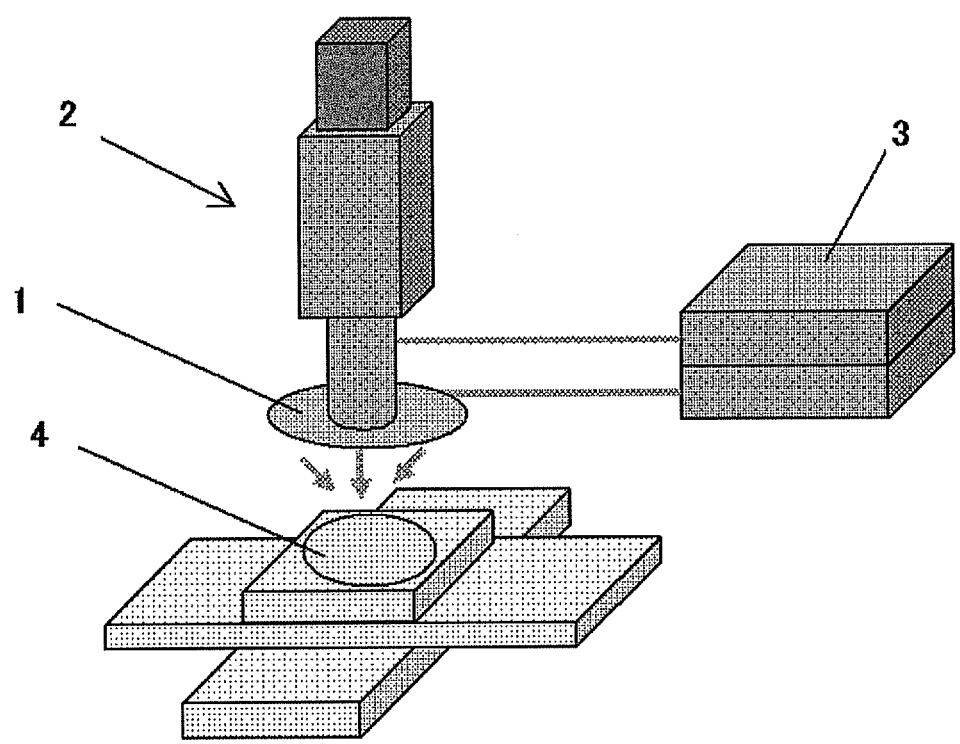
FIG. 2 is a schematic view of a general optical microscope apparatus that can be used in a method for evaluating a thin-film-formed wafer according to the present invention.

As a specific method for applying the light having the selected single wavelength λ, as shown in FIG. 2, for example, irradiation light from a light source 3 of a general optical microscope apparatus 2 having a bandpass filter 1 for wavelength selection disposed thereto can be applied to the partial region of the thin-film-formed wafer 4 to be evaluated.

That is, a microscopic reflected image of the partial region of the thin-film-formed wafer 4 to be evaluated is measured by using the optical microscope apparatus 2 that applies the light having the single wavelength λ, an obtained image is analyzed, reflected light intensity for each pixel is measured, a reflected light intensity distribution in the region is obtained, and the film thickness distribution of the thin film in the region can be calculated from this reflected light intensity distribution.

For the wavelength selection, an OA filter, a liquid crystal wavelength filter, or the like can be used. Moreover, it is preferable to use an irradiation system that can have fixed light irradiation intensity in an observation viewing field and an optical detection system that can have fixed sensitivity in the viewing field. Even in an irradiation system that cannot have fixed light irradiation intensity, a reference sample plane (e.g., a mirror-polished surface of a silicon single crystal wafer) is determined as a reference, and light irradiation intensity can be corrected.

As described above, since the method for evaluating a thin-film-formed wafer according to the present invention can be carried out with visible light by using a regular microscope optical system, and hence a cost can be reduced. Further, the spatial resolution can be freely selected from a value close to a wavelength of the irradiation light to approximately 100 μm by changing a magnification ratio of the microscope.

Moreover, setting a size of one side of the pixel to ½ or above of the selected wavelength λ and 100 μm or below is preferable, and focusing is no longer difficult if such a pixel size is adopted, and the film thickness distribution of the thin film of the thin-film-formed wafer can be more accurately calculated.

Additionally, when the measurement of the partial region is carried out at a plurality of positions, the entire wafer surface can be evaluated. Even if the entire wafer surface is evaluated, since the wavelength is restricted to one wavelength, an amount of calculation is small, a cost is low, and the evaluation can be rapidly performed.

It is to be noted that, to further accurately evaluate the film thickness distribution, the SOI wafer is manufactured, then a film thickness is roughly temporarily confirmed by a conventional film thickness measurement method (e.g., spectroscopic ellipsometry or reflection spectroscopy) to see whether a film thickness close to a set value is obtained, and then the detailed film thickness distribution (a micro film thickness distribution) can be measured according to the present invention.

It is to be noted that, when the region irradiated with the light in the method for evaluating the thin-film-formed wafer according to the present invention can be matched with a lithography exposure site in a device manufacturing process by adjusting a magnification ratio or a viewing field range of the microscope. Since the site used by a stepper at the time of lithography exposure in the device manufacturing process has a size of, e.g., approximately 26×8 mm, the region can be matched with the lithography exposure site by adjusting the magnification ratio or the viewing field range of the microscope.

It is to be noted that the thin film in the present invention means a film formed on a substrate and also a film that enables the irradiation light passed therethrough to be reflected on an interface of a foundation (a substrate surface or another film) and enables reflected light to be detected from the surface side of the thin film.

EXAMPLES

The present invention will now be more specifically explained hereinafter with reference to embodiments and examples, but the present invention is not restricted thereto.

(Embodiment 1)

<Film Thickness Set Values: SOI/BOX/(Si substrate)=88 nm 145 nm/(Si substrate)>

First, as shown in FIG. 3(*a*), a BOX layer film thickness is fixed to 145 nm which is a set value, and wavelength dependency of reflectance (R) is calculated in regard to both 88 nm which is a set value of an SOI layer film thickness and 89 nm which is obtained by increasing this film thickness by 1 nm. At the time of calculation, in the range of wavelengths 400 to 800 nm, 3.68 to 5.59 is used as refractive indexes of the SOI layer and the Si wafer, and 1.45 to 1.47 is used as a refractive index of the BOX layer. (The refractive index is literature data and has wavelength dependency.)

Figure 4:
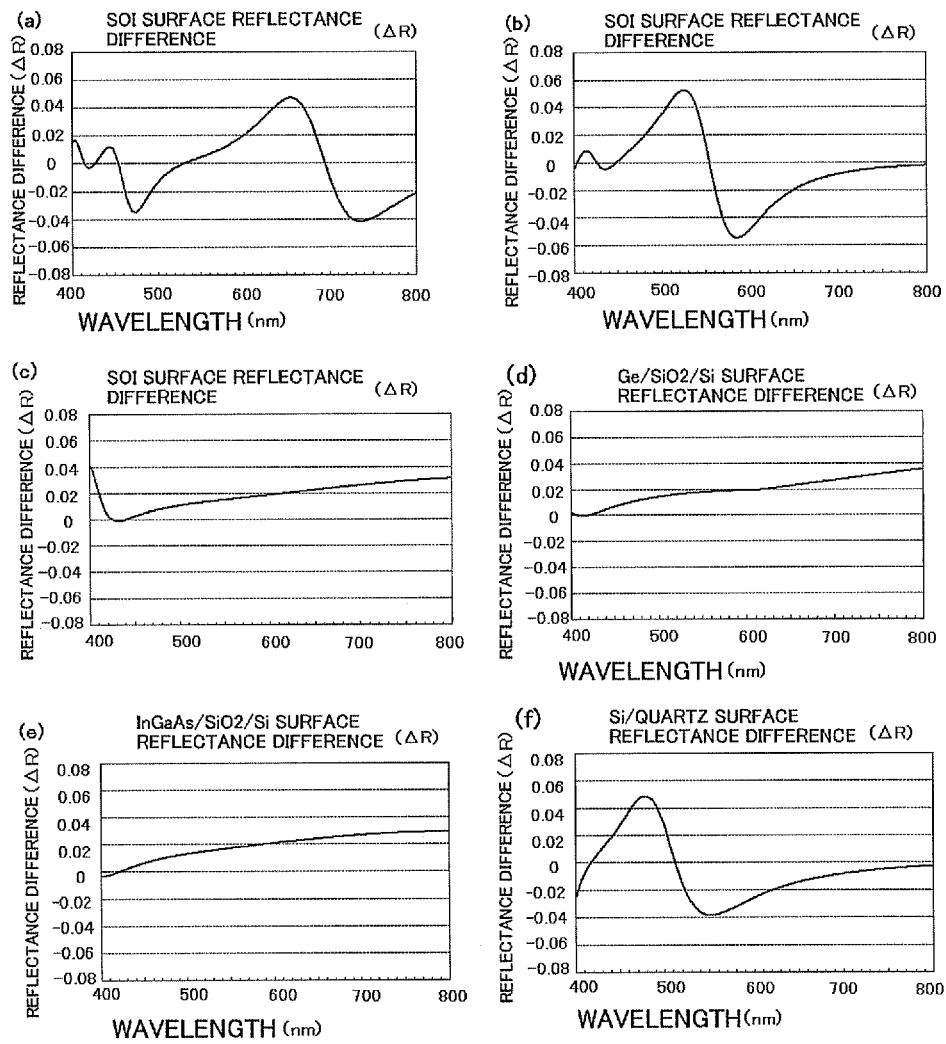
FIG. 4 shows results of calculating wavelength dependency of a reflectance difference ΔR in each of Embodiments 1 to 6.
Figure 5:
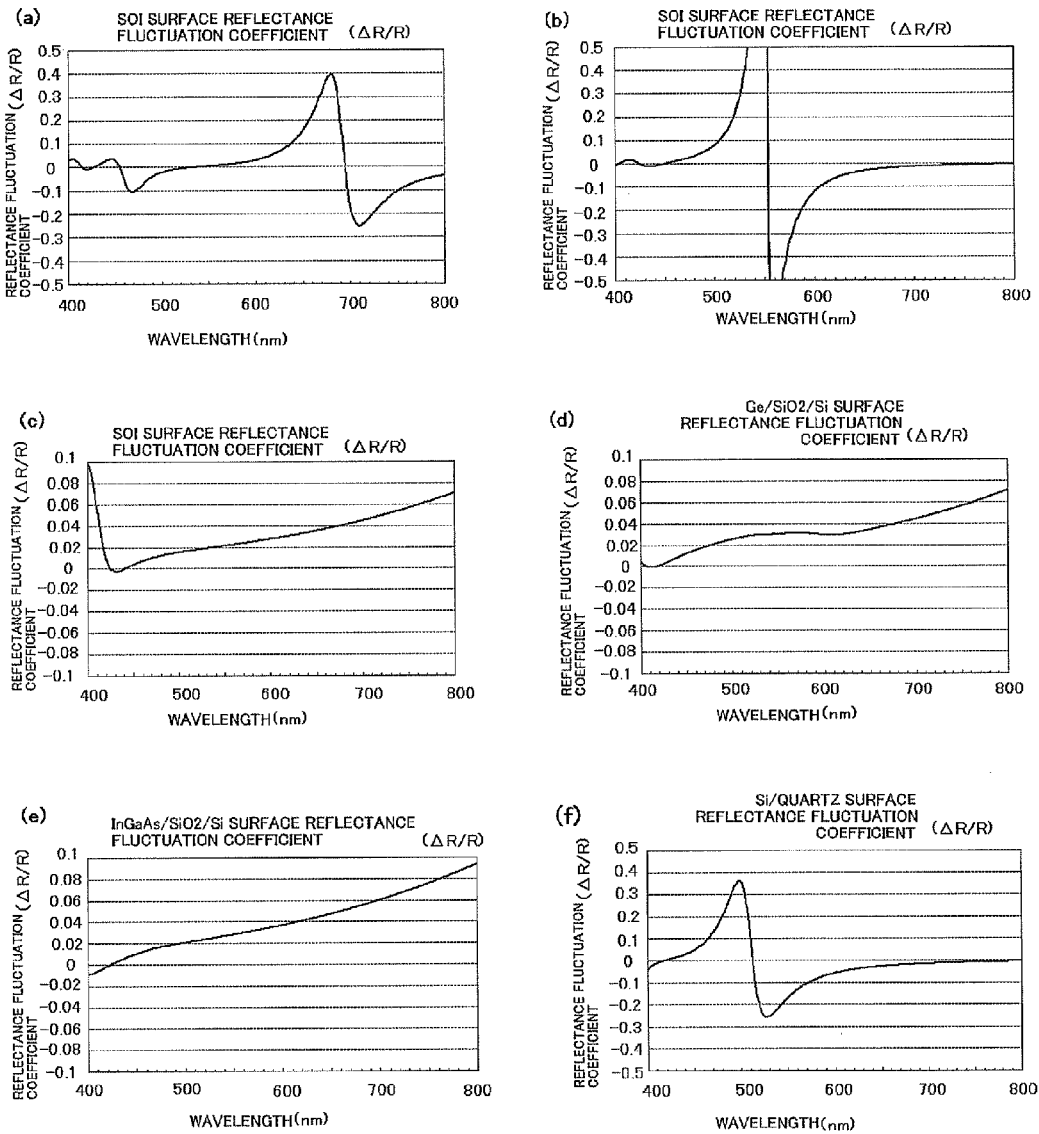
FIG. 5 shows results of calculating wavelength dependency of a reflectance fluctuation coefficient ΔR/R in each of Embodiments 1 to 6.

FIG. 4(*a*) shows a difference between these reflectances ($\Delta R=R_{89}-R_{88}$), and FIG. 5(*a*) shows a result ($\Delta R/R_{88}$) obtained by dividing the reflectance difference by the reflectance. It can be understood from FIG. 3(*a*) and FIG. 5(*a*) that wavelengths in the vicinity of, e.g., 600 to 650 nm have sufficient values, i.e., the reflectance ($R_{88}$) and a reflectance fluctuation coefficient ($\Delta R/R_{88}$), and hence sensitivity is high for a fluctuation in SOI layer film thickness. Therefore, for example, 630 nm is selected as an irradiation wavelength. In case of the wavelength 630 nm, the reflectance ($R_{88}$) is 0.47 and the reflectance fluctuation coefficient ($\Delta R/R_{88}$) is 0.0783/1 nm.

Example 1

FIG. 6 shows microscopic images of an SOI layer in two measurement regions (a measurement region 1, a measurement region 2) taken by using light having a wavelength of 630 nm based on the simulation result in Embodiment 1. (A pixel size: 1 μm, the measurement region: 0.5 mm×0.5 mm (500×500 pixels)).

Figure 7:
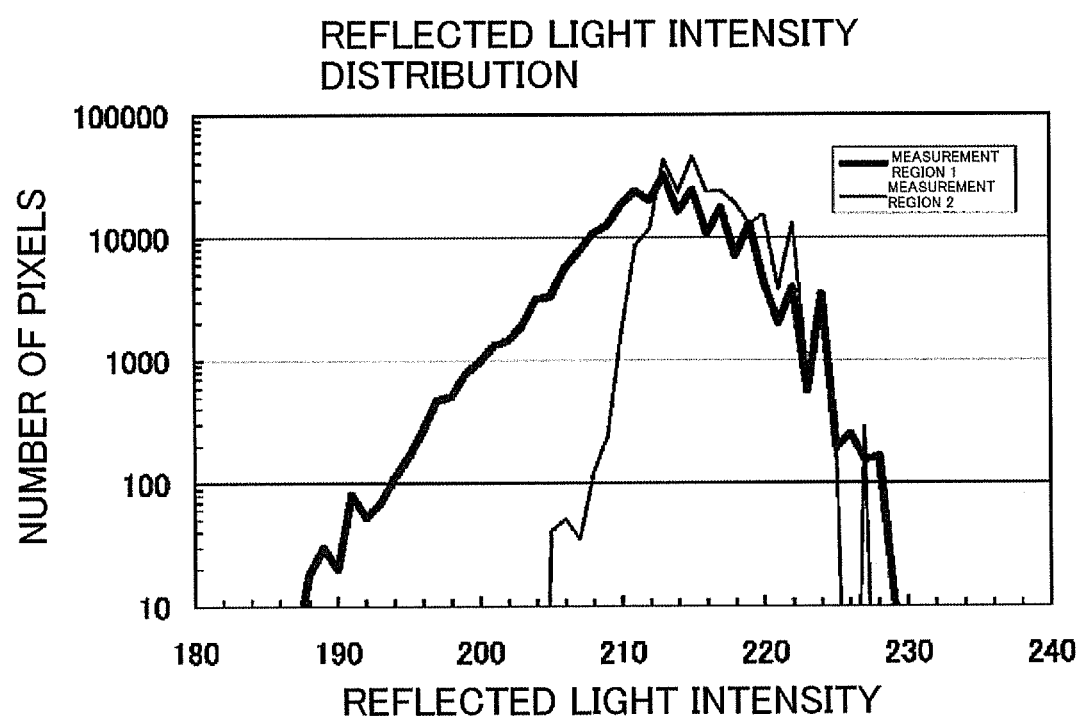
FIG. 7 is a view showing a histogram of light intensity of each pixel in the microscopic images in FIG. 6.

FIG. 7 shows a histogram of light intensity (relative intensity) of each pixel in FIG. 6, and Table 1 shows an SOI layer film thickness distribution (a P-V value) in each measurement region obtained from spread of the light intensity (the histogram).

TABLE 1

|  | Minimum reflection intensity (Min) | Maximum reflection intensity (Max) | Mean reflection intensity (M) | Variation in reflection intensity (A) = (Max − Min)/M | Reflectance fluctuation coefficient ($\Delta R/R_{88}$) | SOI film thickness distribution (nm) |
| --- | --- | --- | --- | --- | --- | --- |
| Measurement region 1 | 188 | 229 | 213 | 0.1925 | 0.0783 | 2.46 |
| Measurement region 2 | 205 | 228 | 210 | 0.1095 | 0.0783 | 1.40 |

It can be understood from Table 1 that the SOI layer film thickness distributions (the P-V values) in the measurement region 1 and the measurement region 2 are 2.46 nm and 1.40 nm, respectively.

Figure 9:
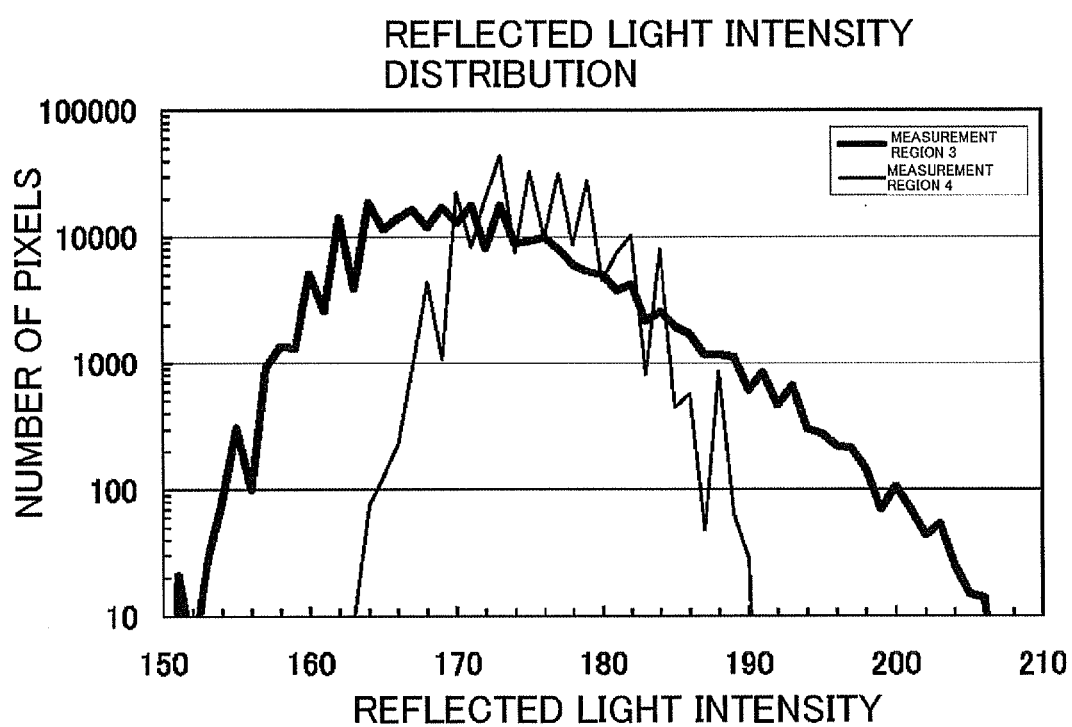
FIG. 9 is a view showing a histogram of light intensity of each pixel in the microscopic images in FIG. 8.

FIG. 9 shows a histogram of light intensity (relative intensity) of each pixel in FIG. 8, and Table 2 shows an SOI layer film thickness distribution (a P-V value) in each measurement region obtained from spread of the light intensity (the histogram).

TABLE 2

|  | Minimum reflection intensity (Min) | Maximum reflection intensity (Max) | Mean reflection intensity (M) | Variation in reflection intensity (A) = (Max − Min)/M | Reflectance fluctuation coefficient ($\Delta R/R_{61}$) | SOI film thickness distribution (nm) |
| --- | --- | --- | --- | --- | --- | --- |
| Measurement region 3 | 152 | 207 | 170 | 0.3235 | 0.0475 | 6.81 |
| Measurement region 4 | 163 | 190 | 176 | 0.1534 | 0.0475 | 3.23 |

It is to be noted that a variation in reflection intensity (A) in Table 1 is a value obtained by a calculation using maximum reflection intensity (Max), minimum reflection intensity (Min), and mean reflection intensity (M) (A=(Max−Min)/M), and $\Delta R/R_{88}$ (a reflectance fluctuation coefficient) is a reflectance fluctuation coefficient per 1 nm of the SOI layer film thickness obtained from FIG. 5(a). Therefore, when the SOI layer film thickness distribution (the P-V value) in each measurement region is assumed to be $\Delta t$, the SOI layer film thickness distribution $\Delta t$ can be calculated based on a relationship of $A=\Delta t \times (\Delta R/R_{88})$.

(Embodiment 2)
<Film Thickness Set Values: SOI/BOX/(Si substrate)=61 nm/145 nm/(Si substrate)>

First, as shown in FIG. 3(b), a BOX layer film thickness is fixed to 145 nm which is a set value, and wavelength dependency of reflectance (R) is calculated in regard to both 61 nm which is a set value of an SOI layer film thickness and 62 nm which is obtained by increasing this film thickness by 1 nm.

FIG. 4(b) shows a difference between these reflectances ($\Delta R=R_{61}-R_{62}$), and FIG. 5(b) shows a result ($\Delta R/R_{61}$) obtained by dividing the reflectance difference by the reflectance. It can be understood from FIG. 3(b) and FIG. 5(b) that wavelengths in the vicinity of, e.g., 600 to 650 nm have sufficient values, i.e., the reflectance ($R_{61}$) and an absolute value of a reflectance fluctuation coefficient ($\Delta R/R_{61}$), and hence sensitivity is high for a fluctuation in SOI layer film thickness. Therefore, for example, 630 nm is selected as an irradiation wavelength. In case of the wavelength 630 nm, the reflectance ($R_{61}$) is 0.60 and the absolute value of the reflectance fluctuation coefficient ($\Delta R/R_{61}$) is 0.0475/1 nm.

Example 2

FIG. 8 shows microscopic images of an SOI layer in two measurement regions (a measurement region 3, a measurement region 4) taken by using light having a wavelength of 630 nm. (A pixel size: 1 μm, the measurement region: 0.5 mm×0.5 mm (500×500 pixels)).

It can be understood from Table 2 that the SOI layer film thickness distributions (the P-V values) in the measurement region 3 and the measurement region 4 are 6.81 nm and 3.23 nm, respectively.

(Embodiment 3)
<Film Thickness Set Values: SOI/BOX/(Si substrate)=12 nm/145 nm/(Si substrate)>

First, as shown in FIG. 3(c), a BOX layer film thickness is fixed to 145 nm which is a set value, and wavelength dependency of reflectance (R) is calculated in regard to both 12 nm which is a set value of an SOI layer film thickness and 13 nm which is obtained by increasing this film thickness by 1 nm. FIG. 4(c) shows a difference between these reflectances ($\Delta R=R_{12}-R_{13}$), and FIG. 5(c) shows a result ($\Delta R/R_{12}$) obtained by dividing the reflectance difference by the reflectance. It can be understood from FIG. 3(c) and FIG. 5(c) that wavelengths in the vicinity of, e.g., 400 to 410 nm have sufficient values, i.e., the reflectance ($R_{12}$) and a reflectance fluctuation coefficient ($\Delta R/R_{12}$), and hence sensitivity is high for a fluctuation in SOI layer film thickness. Therefore, for example, 400 nm is selected as an irradiation wavelength. In case of the wavelength 400 nm, the reflectance ($R_{12}$) is 0.416 and the reflectance fluctuation coefficient ($\Delta R/R_{12}$) is 0.0986/1 nm.

(Embodiment 4)
<Film Thickness Set Values: Ge/SiO$_2$/(Si substrate)=10 nm/145 nm/(Si substrate)>

First, as shown in FIG. 3(d), a BOX layer film thickness is fixed to 145 nm which is a set value, and wavelength dependency of reflectance (R) is calculated in regard to both 10 nm which is a set value of a Ge layer film thickness and 11 nm which is obtained by increasing this film thickness by 1 nm. At the time of calculation, in the range of wavelengths 400 to 800 nm, 4.08 to 5.77 is used as a refractive index of the Ge layer. (The refractive index is literature data and has wavelength dependency.)

FIG. 4(d) shows a difference between these reflectances ($\Delta R=R_{11}-R_{10}$), and FIG. 5(d) shows a result ($\Delta R/R_{10}$) obtained by dividing the reflectance difference by the reflectance. It can be understood from FIG. 3(d) and FIG. 5(d) that wavelengths in the vicinity of, e.g., 600 to 650 nm have sufficient values, i.e., the reflectance ($R_{10}$) and a reflectance fluctuation coefficient ($\Delta R/R_{10}$), and hence sensitivity is high for a fluctuation in SOI layer film thickness. Therefore, for example, 630 nm is selected as an irradiation wavelength. In case of the wavelength 630 nm, the reflectance ($R_{10}$) is 0.67 and the reflectance fluctuation coefficient ($\Delta R/R_{10}$) is 0.0310/1 nm.

(Embodiment 5)
<Film Thickness Set Values: InGaAs/SiO$_2$/(Si substrate)=10 nm/145 nm/(Si substrate)>

First, as shown in FIG. 3(e), a BOX layer film thickness is fixed to 145 nm which is a set value, and wavelength dependency of reflectance (R) is calculated in regard to both 10 nm which is a set value of an InGaAs layer film thickness and 11 nm which is obtained by increasing this film thickness by 1 nm. At the time of calculation, in the range of wavelengths 400 to 800 nm, 3.51 to 4.61 is used as a refractive index of the InGaAs layer. (The refractive index is literature data and has wavelength dependency.)

FIG. 4(e) shows a difference between these reflectances ($\Delta R=R_{11}-R_{10}$), and FIG. 5(e) shows a result ($\Delta R/R_{10}$) obtained by dividing the reflectance difference by the reflectance. It can be understood from FIG. 3(e) and FIG. 5(e) that wavelengths in the vicinity of, e.g., 600 to 650 nm have sufficient values, i.e., the reflectance ($R_{10}$) and a reflectance fluctuation coefficient ($\Delta R/R_{10}$), and hence sensitivity is high for a fluctuation in SOI layer film thickness. Therefore, for example, 630 nm is selected as an irradiation wavelength. In case of the wavelength 630 nm, the reflectance ($R_{10}$) is 0.53 and the reflectance fluctuation coefficient ($\Delta R/R_{10}$) is 0.0436/1 nm.

(Embodiment 6)
<Film Thickness Set Value: Si/(quartz substrate)=60 nm/(quartz substrate)>

In case of an Si thin film on a quartz substrate, as shown in FIG. 3(f), wavelength dependency of reflectance R is calculated in regard to both 60 nm which is a set value of a film thickness of the Si thin film and 61 nm which is obtained by increasing this film thickness by 1 nm. At the time of calculation, in the range of wavelengths 400 to 800 nm, 3.68 to 5.59 is used as a refractive index of the Si thin film, and 1.45 to 1.47 is used as a refractive index of the quartz substrate (SiO$_2$). (The refractive index is literature data and has wavelength dependency.)

FIG. 4(f) shows a difference between these reflectances ($\Delta R=R_{61}-R_{60}$), and FIG. 5(f) shows a result ($\Delta R/R_{60}$) obtained by dividing the reflectance difference by the reflectance. It can be understood from FIG. 3(f) and FIG. 5(f) that wavelengths in the vicinity of, e.g., 460 nm have sufficient values, i.e., the reflectance ($R_{60}$) and a reflectance fluctuation coefficient ($\Delta R/R_9$), and hence sensitivity is high for a fluctuation in SOI layer film thickness. Therefore, for example, 460 nm is selected as an irradiation wavelength. In case of the wavelength 460 nm, the reflectance ($R_{60}$) is 0.46 and the reflectance fluctuation coefficient ($\Delta R/R_{60}$) is 0.0813/1 nm.

Examples 3 to 6

Reflected light intensity for each pixel was measured in two measurement regions by using light having the wavelength selected in each of Embodiments 3 to 6, and a reflected light intensity distribution in each region was obtained, thereby calculating a film thickness distribution of each thin film.

As described above, when the method for evaluating a thin-film-formed wafer according to the present invention was used, a film thickness distribution of a micro thin film (an SOI layer) that affects a device was accurately measured on an entire wafer surface in a simplified manner at a low cost.

It is to be noted that the present invention is not restricted to the foregoing embodiments. The embodiments are just illustrative examples, and any examples that have substantially the same configuration and exert the same operations and effects as the technical concept described claims according to the present invention are included in the technical scope of the present invention.

The invention claimed is:

1. A method for evaluating a thin-film-formed wafer by calculating a film thickness distribution of a thin film of the thin-film-formed wafer having the thin film formed on substrate, the method comprising:
    applying light having a selected single wavelength $\lambda$ to a partial region of a surface of the thin-film-formed wafer;
    detecting reflected light from the partial region;
    measuring a reflected light intensity for each pixel obtained by dividing the partial region into many pieces;
    obtaining a reflected light intensity distribution in the partial region; and
    calculating the film thickness distribution of the thin film in the partial region from the reflected light intensity distribution,
    wherein irradiation wavelength dependency of a reflectance difference and a reflectance fluctuation coefficient involved by a fluctuation in the film thickness of the thin film are calculated in advance from a set value of the film thickness, and
    the single wavelength $\lambda$ is selected in such a manner that calculated reflectance (R) of irradiation light from the set value of the film thickness is 0.2 or above and an absolute value of a calculated reflectance fluctuation coefficient ($\Delta R/R$) with respect to the film thickness is 0.02/1 nm increase in thickness or above.

2. The method for evaluating a thin-film-formed wafer according to claim 1, wherein the wavelength $\lambda$ is selected in such a manner that the absolute value of the reflectance fluctuation coefficient ($\Delta R/R$) is 0.05/1 nm in thickness or above.

3. The method for evaluating a thin-film-formed wafer according to claim 1, wherein the wavelength $\lambda$ is a visible light wavelength.

4. The method for evaluating a thin-film-formed wafer according to claim 2, wherein the wavelength $\lambda$ is a visible light wavelength.

5. The method for evaluating a thin-film-formed wafer according to claim 1, wherein a size of one side of the pixel is ½ or above of the wavelength $\lambda$ and 100 µm or below.

6. The method for evaluating a thin-film-formed wafer according to claim 3, wherein a size of one side of the pixel is ½ or above of the wavelength $\lambda$ and 100 µm or below.

7. The method for evaluating a thin-film-formed wafer according to claim 4, wherein a size of one side of the pixel is ½ or above of the wavelength $\lambda$ and 100 µm or below.

8. The method for evaluating a thin-film-formed wafer according to claim 1, wherein the partial region is matched with a lithography exposure site of a device manufacturing process.

9. The method for evaluating a thin-film-formed wafer according to claim 7, wherein the partial region is matched with a lithography exposure site of a device manufacturing process.

10. The method for evaluating a thin-film-formed wafer according to claim 1, wherein a film thickness distribution of an entire surface of the thin-film-formed wafer is obtained by calculating the film thickness distribution of the thin film in the partial region at a plurality of positions.

11. The method for evaluating a thin-film-formed wafer according to claim 7, wherein a film thickness distribution of an entire surface of the thin-film-formed wafer is obtained by calculating the film thickness distribution of the thin film in the partial region at a plurality of positions.

12. The method for evaluating a thin-film-formed wafer according to claim 9, wherein a film thickness distribution of an entire surface of the thin-film-formed wafer is obtained by calculating the film thickness distribution of the thin film in the partial region at a plurality of positions.

13. The method for evaluating a thin-film-formed wafer according to claim 1, wherein a thin-film-formed wafer which has a second thin film formed between the substrate and the thin film or on the thin film is used as the thin-film-formed wafer as an evaluation target.

14. The method for evaluating a thin-film-formed wafer according to claim 11, wherein a thin-film-formed wafer which has a second thin film formed between the substrate and the thin film or on the thin film is used as the thin-film-formed wafer as an evaluation target.

15. The method for evaluating a thin-film-formed wafer according to claim 12, wherein a thin-film-formed wafer which has a second thin film formed between the substrate and the thin film or on the thin film is used as the thin-film-formed wafer as an evaluation target.

16. The method for evaluating a thin-film-formed wafer according to claim 13, wherein the substrate and the thin film are made of silicon single crystal, and the second thin film formed between the substrate and the thin film is a silicon oxide film.

17. The method for evaluating a thin-film-formed wafer according to claim 14, wherein the substrate and the thin film are made of silicon single crystal, and the second thin film formed between the substrate and the thin film is a silicon oxide film.

18. The method for evaluating a thin-film-formed wafer according to claim 15, wherein the substrate and the thin film are made of silicon single crystal, and the second thin film formed between the substrate and the thin film is a silicon oxide film.

\* \* \* \* \*